(12) United States Patent
Windsheimer

(10) Patent No.: US 6,239,589 B1
(45) Date of Patent: May 29, 2001

(54) METHOD AND DEVICE FOR COMPENSATING FOR ANGLE ERRORS WHEN MEASURING ELECTRICAL POWER

(75) Inventor: Klaus Windsheimer, Spalt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/275,825

(22) Filed: Mar. 25, 1999

Related U.S. Application Data

(63) Continuation of application No. PCT/DE97/02164, filed on Sep. 24, 1997.

(30) Foreign Application Priority Data

Sep. 25, 1996 (DE) .............................................. 196 39 410

(51) Int. Cl.$^7$ .................................................. G01R 21/06
(52) U.S. Cl. ...................................... 324/142; 324/103 R
(58) Field of Search ................................ 324/107, 103 R, 324/142, 141, 115–116; 702/60, 65, 66, 62

(56) References Cited

U.S. PATENT DOCUMENTS

| | | | |
|---|---|---|---|
| 4,837,504 | * | 6/1989 | Baer et al. ............................ 324/142 |
| 5,301,121 | * | 4/1994 | Garverick et al. ................... 324/115 |
| 5,736,848 | * | 4/1998 | De Vires et al. ..................... 324/142 |

FOREIGN PATENT DOCUMENTS

| | | |
|---|---|---|
| 2245426 | 9/1973 | (DE) . |
| 3205840A1 | 1/1983 | (DE) . |
| 2630959C2 | 4/1985 | (DE) . |
| 3414520A1 | 10/1985 | (DE) . |
| 3126485C2 | 1/1990 | (DE) . |
| 3908314C3 | 9/1993 | (DE) . |
| 4221057A1 | 1/1994 | (DE) . |
| 19521609A1 | 1/1996 | (DE) . |
| 19521610A1 | 1/1996 | (DE) . |
| 0104998A2 | 4/1984 | (EP) . |
| 0377282A1 | 7/1990 | (EP) . |
| 0634662A1 | 1/1995 | (EP) . |
| 0681235A2 | 11/1995 | (EP) . |
| 2357907 | 2/1978 | (FR) . |

OTHER PUBLICATIONS

"A Programmable Mixed–Signal ASIC for Power Meterin", Steven L. Garverick et al., IEEE Journal of Solid–State Circuits, vol. 26, No. 12, Dec. 1991, pp. 2008–2015.

\* cited by examiner

*Primary Examiner*—Vinh P. Nguyen
(74) *Attorney, Agent, or Firm*—Hebert L. Lerner; Laurence A. Greenberg; Werner H. Stemer

(57) ABSTRACT

In order to obtain a simple circuit structure for a measuring device with high measuring accuracy, it is provided that current and voltage signals of a load are fed to a multiplexer and, after digitization, are multiplied by one another. In order to compensate for external angle errors, different waiting cycles are generated between the current and voltage values in the digital signal. A measuring device and a method are provided for this purpose. A preferred application is in electricity meters.

8 Claims, 2 Drawing Sheets

METHOD AND DEVICE FOR COMPENSATING FOR ANGLE ERRORS WHEN MEASURING ELECTRICAL POWER

CROSS-REFERENCE TO RELATED APPLICATION

This is a continuation of copending International Application PCT/DE97/02164, filed Sep. 24, 1997, which designated the United States.

BACKGROUND OF THE INVENTION

1. Field of the Invention

The invention relates to a measuring device for electrical power and to a method for measuring the electrical power. The measuring device has a multiplexer connected to an analog-to-digital (A/D) converter. The multiplexer receives current and voltage signals that are digitized by the A/D converter. A digital processing device controlled by a control unit further processes the digitized signals for formulating power values.

In order to determine or measure electrical power of an electrical load, it is known to feed the current and voltage signals acquired at the load in each case to an analog to digital converter (A/D converter) and to multiply them by one another in a downstream digital processing device.

Contemporaneous values of current and voltage are combined with one another in the process.

In order to compensate for angle errors originating, by way of example, from a shunt or a current transformer, a digital filter may be connected downstream of the A/D converter. As an alternative, external compensation using RC circuitry (analog filter) is also possible. A measuring device of this type requires a high outlay on components, so it is appropriate essentially only for high-quality meters having a high level of accuracy.

German Patent DE 26 30 359 C2 discloses a measuring device in which an analog time delay element is used to compensate for a time delay between two signals, which time delay element is connected upstream of a multiplexer.

Published, European Patent Applications EP 0 681 235 A1 and EP 0 634 662 A1 each disclose an electricity meter in which an A/D converter, as in the case of Published, European Patent Application EP 0 377 282 A1, corresponding to U.S. Pat. No. 5,017,860, is used in each case for current and voltage measurement. The A/D converter is in each case configured as a sigma-delta converter.

Published, Non-Prosecuted German Patent Applications DE 195 21 609 A1 and DE 195 21 610 A1 disclose, in connection with electrical energy measurement, using a decimation filter which has a selectable decimation ratio. A reference to the problems in the present case is not provided therein.

SUMMARY OF THE INVENTION

It is accordingly an object of the invention to provide a measuring device for electrical power and a method for measuring the electrical power that overcome the above-mentioned disadvantages of the prior art devices and methods of this general type, in which, despite a low outlay on components, the highest possible measuring accuracy is achieved during measurement of the electrical power with regard to an angle error.

With the foregoing and other objects in view there is provided, in accordance with the invention, an electrical power measuring device, including: a multiplexer for receiving input signals including a current signal and a voltage signal to be measured; an analog-to-digital converter connected to and disposed downstream of the multiplexer, the analog-to-digital converter is a sigma-delta modulator receiving the current signal and the voltage signal and outputs a digital serial signal formed of digitized values of the current signal and the voltage signal; a digital processor connected to and disposed downstream of the sigma-delta modulator and receives the digital serial signal from the sigma-delta modulator; a decimation filter connected between the sigma-delta modulator and the digital processor; and a control logic unit connected to the decimation filter and generating predeterminable waiting cycles in each case between the digitized values of the current signal and the voltage signal forming the digital serial signal for forming respective power values, the control logic unit driving the decimation filter such that a predetermined phase angle is generated between the digitized values of the current signal and the voltage signal in the digital serial signal.

The invention is based on the fundamental concept that, taking the prior art as a departure point, it is possible to eliminate a processing path with an A/D converter, a multiplexer being connected upstream of the remaining processing path as a replacement. However, this has the disadvantage that the respective samples of current and voltage which are provided in the sense of value pairs for a power value to be determined no longer appear simultaneously but rather succeed one another in time.

The present invention uses the disadvantage of the temporal offset in order to compensate for angle errors, error compensation being achieved in an astonishingly simple manner.

Compensation of external angle errors is afforded in this case without additional measures or further components being required. In addition, the angle error compensation has the capability of being adjusted.

The decimation filter used may be part of the processing device or of the A/D converter. This allows the formation of multi-bit data words, as a result of which simple digital measured-value processing by a computer is possible. The error rate is particularly low in this case.

It is expedient if the processing device includes an averaging unit to which the digital values of one of the input signals can be fed. The output average values formed are then used with the digitized values of the respective other input signal in order to form the respective power values. An internal angle error resulting from a temporal offset of the current and voltage signals is thus compensated for.

This can be done, by way of example, as follows: in all instances respectively successive current and voltage values are multiplied directly by one another, thereby producing a doubling of power values which, in total, achieve an average value effect. As an alternative, the average value of, for example, two voltage values adjacent to a current value can also be formed directly and then be multiplied by the current value.

It is expedient if the A/D converter includes a sigma-delta modulator. This makes it possible for a digital signal to be formed in a simple manner. This component makes it possible to achieve good linearity and a high degree of stability in the measured-value processing.

The power values are preferably accumulated in the processing device for the purpose of forming at least one energy value. By way of example, the energy value can then be stored for accounting or else be summed with further subsequent energy values.

The measuring device is preferably used in meters for electrical energy and/or power, integration in a control device for energy measurement also being conceivable, of course.

In the method of the invention, the serial signal is advantageously an output signal of a multiplexer. The use of a particularly simple component is possible as a result of this.

It is expedient if the output signal is subjected to analog-to-digital conversion and a digital signal is generated in the process. Simple downstream digital signal processing is possible in this way. The digital signal is preferably configured as a 1-bit stream. This affords fast signal processing with few errors. 1-bit A/D converters have a simple analog circuit, the formation of high-resolution digital words in the digital section being afforded.

The 1-bit stream can subsequently be converted into multi-bit words, thereby affording conventional digital signal processing in which conventional components, in particular digital signal processors, are used.

During the conversion of the 1-bit stream into multi-bit words, waiting cycles are provided between the current and voltage values, and have a predeterminable length. Adjustable compensation is afforded in this way, it being possible to make use of waiting cycles which are possibly present in any case in decimation filters. The jargon also speaks of waiting times in this context.

The power values generated are preferably accumulated for the purpose of forming an energy value. This affords simple measurement of energy consumption.

Other features which are considered as characteristic for the invention are set forth in the appended claims.

Although the invention is illustrated and described herein as embodied in a measuring device for electrical power and a method for measuring the electrical power, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
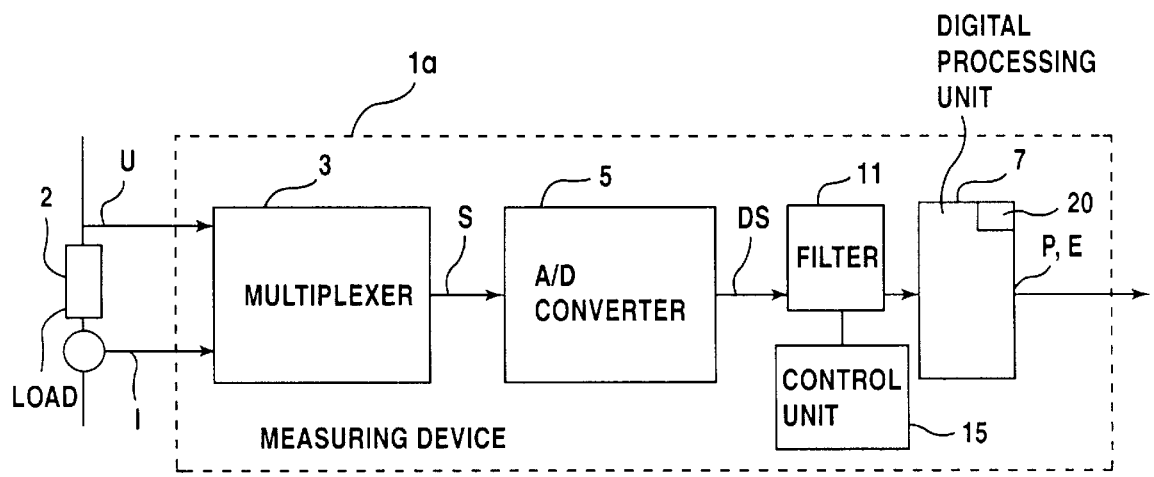
FIG. 1 is a diagrammatic block diagram of a power measuring device according to the invention.

In all the figures of the drawing, sub-features and integral parts that correspond to one another bear the same reference symbol in each case. Referring now to the figures of the drawing in detail and first, particularly, to FIG. 1 thereof, there is shown a measuring device 1a for measuring electrical power (single-phase). Analog measured values or signals for a current I and a voltage U, which are picked off from an electrical load 2, are fed as input signals to the measuring device 1a. The two input signals I, U are firstly fed to a multiplexer 3. At its output, the multiplexer 3 generates a serial signal S, in which the values of the current signal and of the voltage signal U, I alternately succeed one another. The pairs of signal values that respectively succeed one another in this case are temporally offset with respect to one another with regard to the desired acquisition instant. The serial signal S will be explained in more detail later.

The serial signal S is subsequently converted into a digital signal DS with the aid of an analog-to-digital converter 5, which digital signal is fed to a decimation filter 11. The decimation filter 11 is assigned a control logic unit 15. In a digital processing device 7 connected downstream of the decimation filter 11, the respective digitized values of the current signal and of the voltage signal I and U, respectively, are multiplied to form power values P, which are then made available at the output for further processing. If appropriate, further processing of the digitized values of the current signal and of the voltage signal I and U may also be provided within the processing device 7, the further processing being, by way of example, accumulation, with the result that energy values E are formed.

The digital processing device 7 is preferably a computer, for example with a microcomputer, and/or as a digital signal processor. The power or energy values P or E, respectively, present at the output can be forwarded, by way of example, for transfer to a recording device or another control device, including for a remote reading possibility or a display device. The power measuring device 1a may, especially, also be part of an electricity meter.

Figure 2:
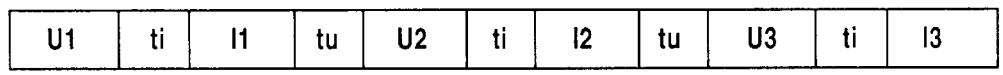
FIG. 2 is an illustration of a signal diagram.

The illustration according to FIG. 2 shows further details regarding the signal processing. An excerpt from the digital signal DS fed to the decimation filter 11 is shown here, current and voltage values I and U, respectively, being shown in succession. Respectively adjacent current and voltage values I and U, respectively, are temporally offset with respect to one another, as already mentioned above. I1 to I3 and U1 to U3 are chronologically successive values. Direct multiplication of these values by one another in the sense of current-voltage pairs (for example I1×U1, I2×U2, etc.) would result in an angle error, as already described above.

A first possibility of compensating for internal angle errors is achieved as follows: in all instances respectively successive current and voltage values (for example the values U1 and I1, I1 and U2, U2 and I2 etc.) are multiplied by one another. Thus, virtually a double number of power values is generated, which power values, although they each include an inaccuracy or an angle error, in total attain averaging, thereby affording compensation of an internal angle error, e.g. caused by the multiplexer 3.

A second possibility of compensating for errors is provided by direct averaging. For this purpose, by way of example, the average value of U1 and U2 is formed, i.e. ([U1+U2]/2), which is then multiplied by the current value I1 in order to calculate the power. Even further possibilities of simple averaging can also be realized. The averaging is carried out in the digital processing device 7, which includes a suitable averaging unit 20, for example a program module, for this purpose.

Figure 3:
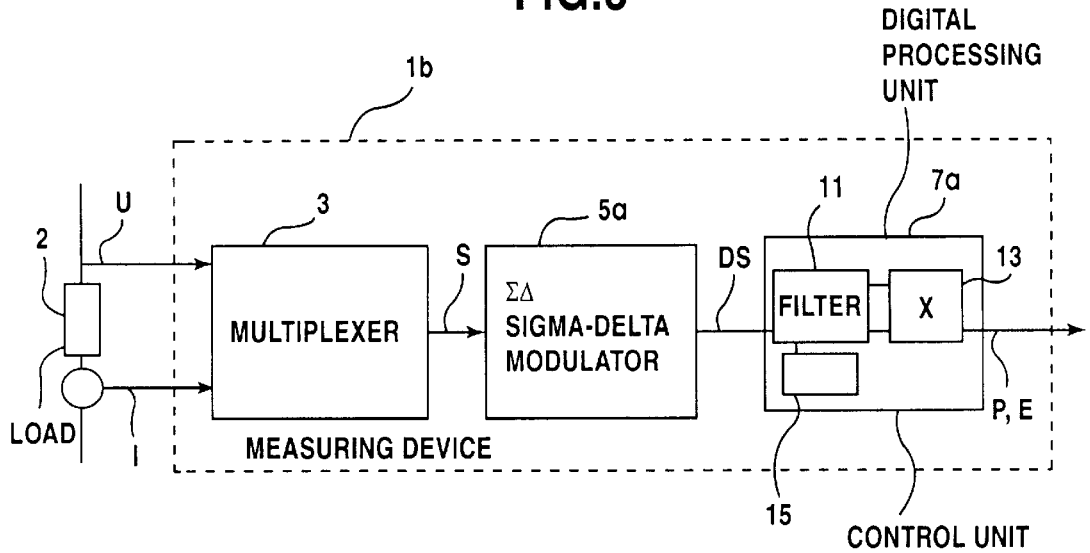
FIG. 3 is a block diagram of a further power measuring device.

FIG. 3 shows a further power measuring device 1b in a detailed illustration. In this case, the analog-to-digital converter 5a includes a sigma-delta modulator SD, which generates a 1-bit stream as the digital signal DS at its output.

The downstream digital processing device 7a includes the decimation filter 11 and a multiplier 13 connected downstream. The decimation filter 11 is used to convert the 1-bit stream into multi-bit words. Multi-bit words can be processed in a particularly simple manner by digital signal processors or microcomputers. This applies in particular to the realization of the multiplier 13 connected downstream. The latter operates according to the procedure already described above.

The decimation filter 11 is assigned the control logic unit 15, which affords adjustability of the conversion of the 1-bit stream into multi-bit words.

Time intervals, waiting times or waiting cycles ti and tu are respectively inserted between the current and voltage values I and U, respectively, illustrated in FIG. 2. The insertion is effected by the control logic unit 15 in this case. In principle, the waiting cycles ti, tu are provided for the purpose of avoiding overcoupling between successive values, in particular the values of current and voltage. In practice, the waiting cycles ti, tu are realized as follows: after the formation of a digital value, or better of a multi-bit word, in the decimation filter 11 and internal multiplexer 17 (see FIG. 4) therein, the multiplexer 17 is switched over and the decimation filter 11 is reset for the waiting time. So-called "wait states" are thus generated. In this respect, reference is also made to the explanations regarding FIG. 4.

These waiting cycles ti, tu are utilized advantageously in the present case. Specifically, the waiting cycles ti, tu are configured to be adjustable. The adjustability is parameterizable, e.g. between 1 and 128 cycles. The waiting time tu between the current I1 and the subsequent voltage U2 is fixedly set at, for example, just a few cycles, e.g. 6 cycles. By suitable selection of the waiting cycles ti between the voltage U2 and the subsequent current I2, a phase angle can be generated and an angle error can thus be compensated for. This applies in particular to converter errors, such as occur e.g. in the course of the measured, value acquisition and can be excellently compensated for in this way.

Only a small number of components are necessary in the case of the present measuring device 1a, 1b. Only a small chip area is necessary in an ASIC configuration. The current consumption is very low. In addition, modulation overcoupling via the supply voltage or via the substrate of the ASIC is kept slight.

Figure 4:
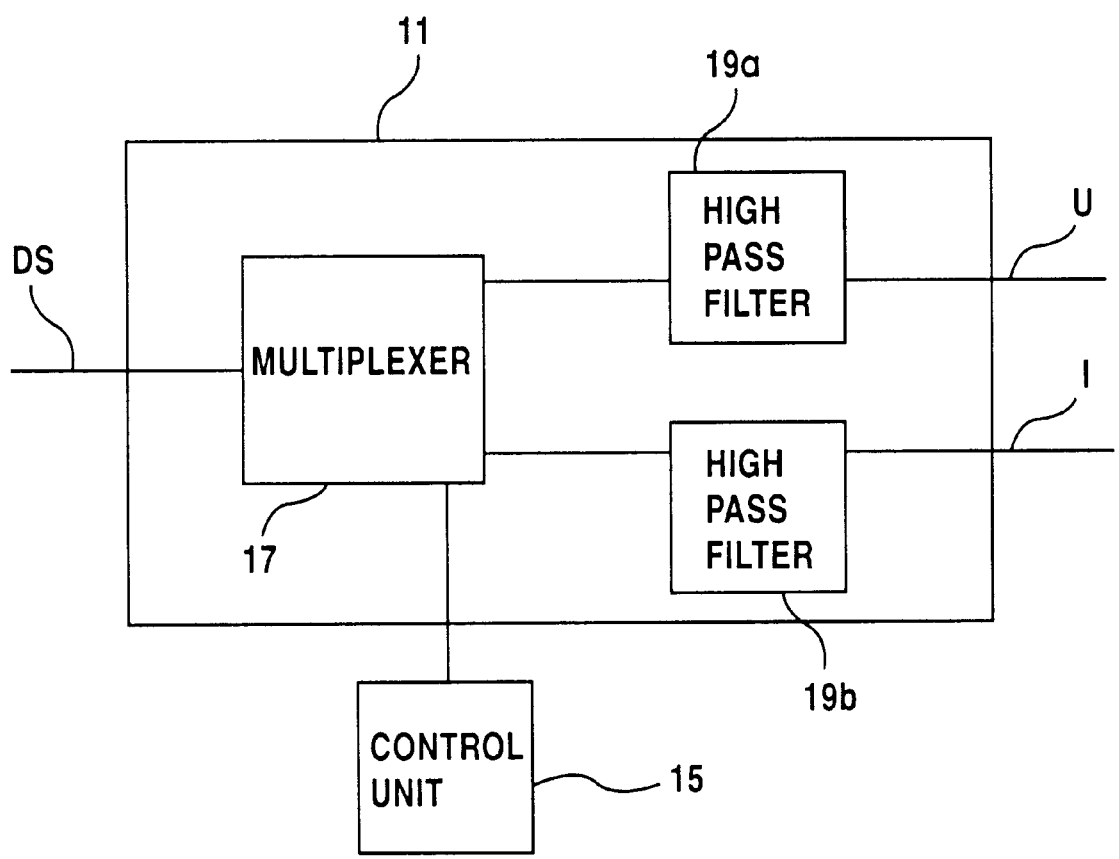
FIG. 4 is a block diagram of a decimation filter according to FIG. 3.

FIG. 4 shows a possible configuration of the decimation filter 11 in detail. It essentially includes the multiplexer 17, which is assigned, at its outputs, a respective high-pass filter 19a and 19b for the respective value of current and voltage. The respectively generated multi-bit values are then present at the outputs, as described above.

It goes without saying that the measuring devices demonstrated are also suitable for the processing of further signals, e.g. for the processing of additional temperature signals, or for polyphase signal processing, e.g. for three-phase current, in which case compensation by waiting time parameterization according to the method described above can also be provided for the further signals. In principle, alternative compensation by a variable window width in the decimation filter 11 is also conceivable, as a result of which, in principle, a phase angle in the sense described above can likewise be generated. Further technical measures in terms of circuitry or the method may be necessary in this case.

The measuring devices demonstrated are particularly suitable for application in electricity meters for measuring electrical energy, for example in single-phase or polyphase domestic meters. It goes without saying that individual features of the various configurations can advantageously be combined with one another within the scope of expert skill without leaving the fundamental concept behind the idea. What is essential for this purpose is that interpolation is achieved by averaging, the interpolation being used to compensate for internal angle errors. Furthermore, adjustable angle-error compensation is afforded by the variable waiting time between the current and voltage values, by which external angle errors are also taken into account.

I claim:

1. An electrical power measuring device, comprising:
   a multiplexer for receiving input signals including a current signal and a voltage signal to be measured;
   an analog-to-digital converter connected to and disposed downstream of said multiplexer, said analog-to-digital converter being a sigma-delta modulator receiving the current signal and the voltage signal and outputting a digital serial signal formed of digitized values of the current signal and the voltage signal;
   a digital processor connected to and disposed downstream of said sigma-delta modulator and receiving the digital serial signal from said sigma-delta modulator;
   a decimation filter connected between said sigma-delta modulator and said digital processor; and
   a control logic unit connected to said decimation filter and generating predeterminable waiting cycles in each case between the digitized values of the current signal and the voltage signal forming the digital serial signal for forming respective power values, said control logic unit driving said decimation filter such that a predetermined phase angle is generated between the digitized values of the current signal and the voltage signal in the digital serial signal.

2. The measuring device according to claim 1, wherein said digital processor has an averaging unit receiving the digitized values of the current signal and the voltage signal, said averaging unit outputting average values used to form the respective power values with the digitized values of a respective other input signal.

3. The measuring device according to claim 2, wherein the average values are formed by the digitized values of the voltage signal.

4. The measuring device according to claim 1, wherein the respective power values are accumulated in said digital processor for forming at least one energy value.

5. The measuring device according to claim 1, wherein said multiplexer, said digital processor, said decimation filter, said control logic unit and said sigma-delta modulator form an electricity meter.

6. A method for measuring electrical power at a load, which comprises:
   continuously acquiring current values of a current signal and voltage values of a voltage signal;
   using a multiplexer, to generate a common serial signal in which the current and voltage values alternately succeed one another;
   converting the common serial signal into a 1-bit stream via an analog-to-digital conversion;
   converting the 1-bit stream into a plurality of multi-bit words representing the alternately successive current and voltage values;
   using a decimation filter to provide a time delay between each of the multi-bit words representing the alternately successive current and voltage values, the time delay having a length that is adjustable;
   using a control logic unit to set the length of the time delay between each of the multi-bit words;
   using the length of the time delay for forming an angular shift between at least some of the alternately successive current and voltage values represented by the multi-bit words; and
   using immediately successive ones of the multi-bit words for forming respective power values.

7. The method according to claim 6, which comprises multiplying directly the successive ones of the multi bit words by one another during the using step.

8. The method according to claim 6, which comprises accumulating the respective power values for forming an energy value.

* * * * *